US007657855B1

(12) United States Patent
Manaker, Jr. et al.

(10) Patent No.: US 7,657,855 B1
(45) Date of Patent: Feb. 2, 2010

(54) EFFICIENT TIMING GRAPH UPDATE FOR DYNAMIC NETLIST CHANGES

(75) Inventors: Walter A. Manaker, Jr., Boulder, CO (US); Nicholas A. Mezei, Thornton, CO (US); David A. Ewing, Superior, CO (US); Sankaranarayanan Srinivasan, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 270 days.

(21) Appl. No.: 11/805,954

(22) Filed: May 25, 2007

(51) Int. Cl.
*G06F 17/50* (2006.01)
(52) U.S. Cl. .............................................. 716/6; 716/5
(58) Field of Classification Search .................. 716/4–6
See application file for complete search history.

(56) References Cited

U.S. PATENT DOCUMENTS

| | | | | |
|---|---|---|---|---|
| 5,751,596 | A * | 5/1998 | Ginetti et al. .................. | 716/6 |
| 5,880,967 | A * | 3/1999 | Jyu et al. ........................ | 716/6 |
| 5,923,564 | A * | 7/1999 | Jones, Jr. ........................ | 716/6 |
| 6,530,073 | B2 * | 3/2003 | Morgan ........................ | 716/18 |
| 7,010,763 | B2 * | 3/2006 | Hathaway et al. ............... | 716/2 |
| 7,155,691 | B2 * | 12/2006 | Ratzlaff ......................... | 716/6 |
| 7,197,732 | B2 * | 3/2007 | Murgai ............................ | 716/6 |
| 7,243,315 | B2 * | 7/2007 | Tan et al. ........................ | 716/2 |
| 7,500,207 | B2 * | 3/2009 | Bhattacharya et al. .......... | 716/4 |
| 2004/0230921 | A1 * | 11/2004 | Hathaway et al. ............... | 716/2 |
| 2005/0223345 | A1 * | 10/2005 | Furusawa ........................ | 716/4 |
| 2007/0150846 | A1 * | 6/2007 | Furnish et al. .................. | 716/8 |
| 2007/0250800 | A1 * | 10/2007 | Keswick ......................... | 716/8 |
| 2008/0244473 | A1 * | 10/2008 | Parker et al. .................... | 716/2 |

OTHER PUBLICATIONS

Mahmood et al.; "A method for timing driven datapath synthesis"; Proceedings of the Eighth Annual IEEE International; Sep. 18-22, 1995; pp. 362-365.*
Hitchcock, R., "Timing Verification and the Timing Analysis Program", Proceedings 19th Design Automation Conference, 1982, pp. 446-456.

* cited by examiner

*Primary Examiner*—Naum B Levin
(74) *Attorney, Agent, or Firm*—LeRoy D. Maunu

(57) ABSTRACT

Various approaches for incrementally updating the timing of an implementation of an electronic circuit design are disclosed. In one approach, a subset timing graph is selected from a primary timing graph. Alternative subset timing graphs are generated that are functionally equivalent and structurally different with respect to the selected subset timing graph. For each of the alternative timing graphs, a respective timing metric is determined. The determined timing metrics and a timing metric for the selected subset timing graph are compared. An alternative timing graph is selected in response to the comparison. Structurally different portions of the selected one of the one or more alternative timing graphs are verified with regard to the design constraints. The structurally different portions are stored to the primary timing graph.

20 Claims, 7 Drawing Sheets

EFFICIENT TIMING GRAPH UPDATE FOR DYNAMIC NETLIST CHANGES

FIELD OF THE INVENTION

The present invention generally relates to physical design of electronic circuits, and more particularly to improving the physical design of a programmable logic device through netlist changes.

BACKGROUND

Programmable logic devices (PLDs), such as field-programmable gate arrays (FPGAs), are user-programmable integrated circuits that can be programmed to implement user-defined logic circuits. In a typical FPGA architecture, an array of configurable logic blocks (CLBs) and a programmable interconnect structure are surrounded by a ring of programmable input/output blocks (IOBs). Other FPGA architectures implement columns of IOBs, memory blocks and hard cores throughout the logic array. The programmable interconnect structure comprises interconnects and configuration memory cells. Each of the CLBs and the IOBs also includes configuration memory cells. The content of the configuration memory cells determines how the CLBs, the IOBs and the programmable interconnect structure are configured. Additional resources, such as multipliers, block random access memory (BRAM) and microprocessors are also included on an FPGA for use in user-defined circuits.

In order to realize a user-defined circuit, a configuration bitstream is loaded into the configuration memory cells such that the CLBs and IOBs are configured to implement particular circuit components used by the user-defined circuit. The configuration bitstream also programs the configuration memory cells of the programmable interconnect structure creating the desired connections between the various configured CLBs and IOBs.

The configuration bitstream is generally created through use of multiple electronic design tools. The processing of a design from the initial inception through creation of a configuration bitstream is often referred to as the "design flow." A design flow generally begins with an architecture description that is defined by a hardware description language (HDL), such as Verilog, very-high-speed integrated circuit hardware description language (VHDL), or advanced Boolean equation language (ABEL). In addition to functional descriptions, the design description may include certain timing requirements. These timing requirements are often checked using a static timing analyzer (STA). Synthesis tools convert the HDL design into a gate-level representation that can be mapped to a specific-device, such as a field-programmable gate array (FPGA). Logic delays can be estimated for the representative gates. However, interconnection delays may be difficult to determine because the routing between logic has not yet been determined. A placement tool places the gate-level representation into prefabricated locations on the PLD. A routing tool allocates routing resources between these locations. Such allocation is represented by a fully placed and routed netlist.

Static timing analysis (STA) is often performed on the netlist to identify timing constraints. STA is the process of analyzing the temporal relationships of a circuit. One method of implementing STA involves the use of directed graphs to represent various nodes and their connections. Expected signal propagation timings are represented by the directed graphs and used to compare against timing requirements or to identify worst case paths. A problem with synthesis optimizations is that changes may be required in the topology of the input netlist and the circuit. Such changes may invalidate any previous graph representations and require regeneration of the timing topology and timing state of the graph. Further problems with synthesis optimizations relate to the efficiency of the optimization. Exhaustive optimization techniques that analyze large circuits all at once may not scale well with different design/circuit sizes and may require complicated algorithms and multiple passes by place and route modules.

The present invention may address one or more of the above issues.

SUMMARY OF THE INVENTION

The various embodiments of the invention provide a number of approaches for implementing an electronic design. In one embodiment, the design's timing is represented by a timing graph that includes nodes and their connections, or arcs. Portions of the timing graph are identified for potential change. A computer implemented program creates one or more alternative timing graphs. The program compares the various graphs with regard to one or more design criteria. The program uses the comparison to select a timing graph and the original graph is updated with the selected timing graph.

In one embodiment, a processor-implemented method for processing an electronic circuit design is implemented. The design is represented by a netlist and a corresponding primary timing graph identifying a plurality of input and output pins and a plurality of logic blocks and a plurality of connections between the plurality of input and output pins. The method comprises: selecting a subset timing graph from the primary timing graph; generating one or more alternative subset timing graphs that are functionally equivalent and structurally different with respect to the selected subset timing graph; for each of the one or more alternative timing graphs, determining a respective timing metric; comparing determined timing metrics and a timing metric for the selected subset timing graph; selecting one of the one or more alternative timing graphs in response to the comparison; verifying structurally different portions of the selected one of the one or more alternative timing graphs against design constraints; and storing said structurally different portions to the primary timing graph.

In another embodiment, an apparatus for processing an electronic circuit design is implemented. The design is represented by a netlist and a corresponding primary timing graph identifying a plurality of input and output pins and a plurality of logic blocks and a plurality of connections between the plurality of input and output pins. The apparatus comprises: means for selecting a subset timing graph from the primary timing graph; means for generating one or more alternative subset timing graphs that are functionally equivalent and structurally different with respect to the selected subset timing graph; means for determining, for each of the one or more alternative timing graphs, a respective timing metric; means for comparing determined timing metrics and a timing metric for the selected subset timing graph; means for selecting one of the one or more alternative timing graphs in response to the comparison; means for verifying structurally different portions of the selected one of the one or more alternative timing graphs against design constraints; and means for storing said structurally different portions to the primary timing graph.

In one embodiment, an article of manufacture is implemented for processing an electronic circuit design. The design is represented by a netlist and a corresponding primary timing graph identifying a plurality of input and output pins and a plurality of logic blocks and a plurality of connections between the plurality of input and output pins. The article of manufacture comprises: a processor-readable storage medium configured with processor executable instructions for generating an implementation of an electronic circuit design by performing the steps including, selecting a subset timing graph from the primary timing graph; generating one or more alternative subset timing graphs that are functionally equivalent and structurally different with respect to the selected subset timing graph; for each of the one or more alternative timing graphs, determining a respective timing metric; comparing determined timing metrics and a timing metric for the selected subset timing graph; selecting one of the one or more alternative timing graphs in response to the comparison; verifying structurally different portions of the selected one of the one or more alternative timing graphs against design constraints; and storing said structurally different portions to the primary timing graph.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
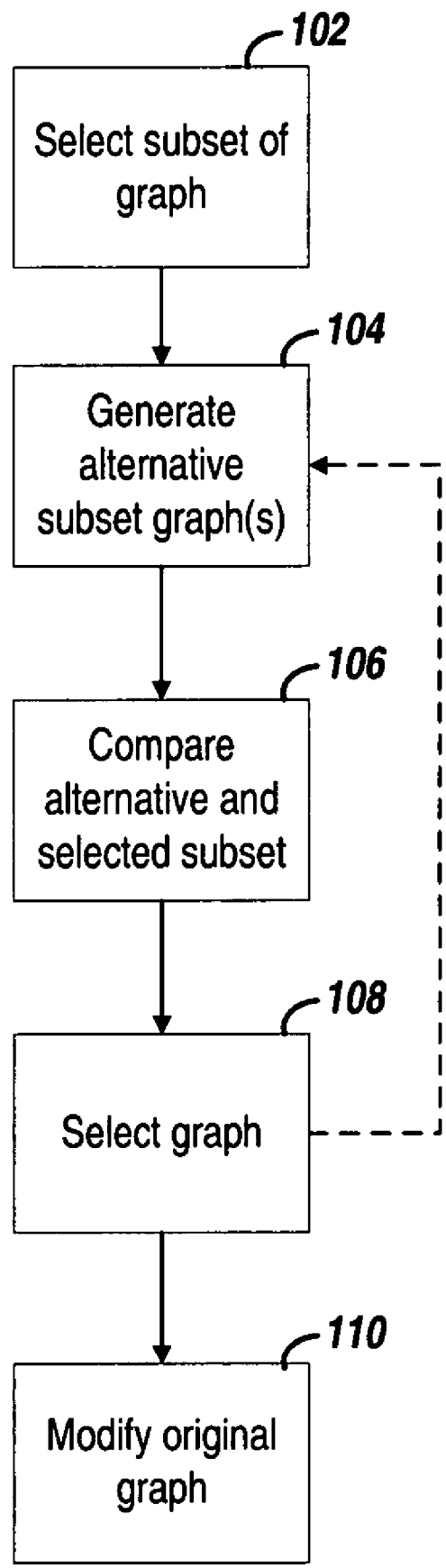
FIG. 1 depicts a basic flow diagram for a computer implemented optimization process for physical synthesis of a PLD, according to an example embodiment of the invention.

The various embodiments of the invention provide methods and apparatus for optimizing an integrated circuit design. One or more aspects in accordance with the invention are described in terms of a field programmable gate array (FPGA). While specific reference is made to an FPGA, those skilled in the art will appreciate that one or more aspects of the invention may be used for designing other types of integrated circuits, such as complex programmable logic devices (CPLDs), application specific integrated circuits (ASICs), and the like.

Consistent with one example embodiment of the present invention, a computer implemented method identifies potential design optimizations and provides dynamically updated timing states that correspond to selected optimizations. The identification and implementation of the optimization may be performed after the place-and-route stage of the design flow. This may be particularly useful for implementing optimizations that benefit from the use of increased accuracy obtained from timing models based on information received from the placed-and-routed design. In a specific example, the optimizations can be implemented without running the place-and-route processes a second time. Thus, the method can evaluate the timing benefit from proposed netlist changes and update the graph representation of the circuit due to selected netlist changes, without necessitating that the timing topology and timing state be re-generated. Such a method can be useful for reducing the processing time required for implementing the optimizations and for maintaining the integrity of the current timing diagrams.

Consistent with another example embodiment of the present invention, the design optimization is implemented using an iterative optimization process. Subsets of the entire design are selected for optimization and, if necessary, changed to improve the overall design. In one instance, the subsets are optimized sequentially by repeating the optimization process for each subset. Alternatively, multiple subsets can be optimized in parallel. Several types of optimizations can be performed on the subsets, including various timing related optimizations.

A number of terms are useful in describing various aspects of the invention. As used herein and unless otherwise stated the following definitions are used to describe these aspects. A circuit path describes the logical flow of information in the design from source to sink including a list of resources (e.g., logic and interconnections) ordered according to the logical flow of information. A path source is the first resource in the path, and the path sink is the last resource in the path. A directed graph is graph G={N, A} with node set N and arc set A, where the arcs of A are unidirectional. A cycle is a path of G that contains a given node n∈N more than once. A directed acyclic graph (DAG) is a directed graph without cycles. A fan-in is an input arc incident to a node in a directed graph, and a fanout is an output arc incident to a node in a directed graph. The arrival time relative to a point within the path is defined as the sum of the delays of the logic and interconnection resources preceding that point in the path. The arrival time may include an initial phase offset at the source, representing the clock arrival at the path source relative to the path destination. The required time of any point within the path is defined as the user-specified time at the destination of the path, less the sum of the delays of the logic and interconnection resources succeeding that point in the path. Slack is defined as the difference between the required time and the arrival time of any point in the path.

Turning now to the figures, FIG. 1 shows a flow diagram for a computer implemented optimization process according to an example embodiment of the invention. The optimization process proceeds through steps 102 to 110, thereby producing the optimized design as an output of the process. One or more processors and a suitable memory arrangement may be used in implementing the optimization steps.

At step 102, the process identifies at least one subset graph. In one instance, the process may identify the subset graph by simply selecting the first subset graph from a list and then iteratively selecting subsequent subset graphs from the list, thereby progressively optimizing the design. In another instance, the process may identify the subset graph through a comparison of various timing or other optimization criteria, such as selecting a subset graph because a node in the subset violates a timing constraint of the overall design.

At step 104, the process generates one or more alternative subset graphs. With regard to the source and sink connections, the process generates alternative subset graphs that do not violate constraints of the overall design. This can be accomplished by verifying a potential subset is compatible with the design constraints and/or by controlling the generation of the alternative subset graphs so as to avoid creating subsets that are incompatible. For instance, alternative subset graph generation could be limited to modifications of the original subset graph that guarantee that the logical functionality of the subset graph remains consistent. Accordingly, the resulting alternative subset graphs have structural differences from the underlying subset graph while maintaining functional equivalence.

Numerous changes may be made to a subset graph to optimize the graph depending upon the type of optimization to be carried out. For instance, a design may be optimized for average path timing, critical path timing, slack timing, average net loading and other design constraints. A particular example embodiment is described in more detail below in which slack timing is used to optimize the design. Generally, the process modifies the subset graph by first identifying a worst case path or rule constraint violation. The process then modifies the identified path according to various possible optimization techniques. Various optimization techniques may be used including, but not limited to, FLOP or LUT replication to unload a critical signal; switching to move a critical logic input upstream; combining logic to move a critical input upstream, and FLOP control switching. Other example optimizations include re-timing forward or backward (e.g., moving a pipeline stage forward or backward in the circuit to shorten a logic path).

At step 106, the process compares the alternative subset graph generated in step 104 to the original subset graph. In this manner the process determines whether or not the alternate subset graph is an improvement over the original subset graph. The process may use a number of different criteria in the comparison. For example, the process may use one or more of timing delays, slack and timing constraints as criteria in the comparison. These and other criteria can be used to determine worst case scenarios or average values for the subset graphs.

At step 108, the process selects between the alternative subset graph and the original subset graph based upon the comparison performed in step 106. The process may optionally repeat steps 104 through 108 as shown by the dashed line. More specific examples of how and when such steps might be repeated are discussed further herein.

In step 110, the process commits the subset graph selected in step 108 to the design. This may involve the replacement and deletion of various resources relative to the differences between the original subset graph and the selected subset graph. Careful implementation of the commit step avoids the need to destroy and reconstruct the entire graph.

Figure 2:
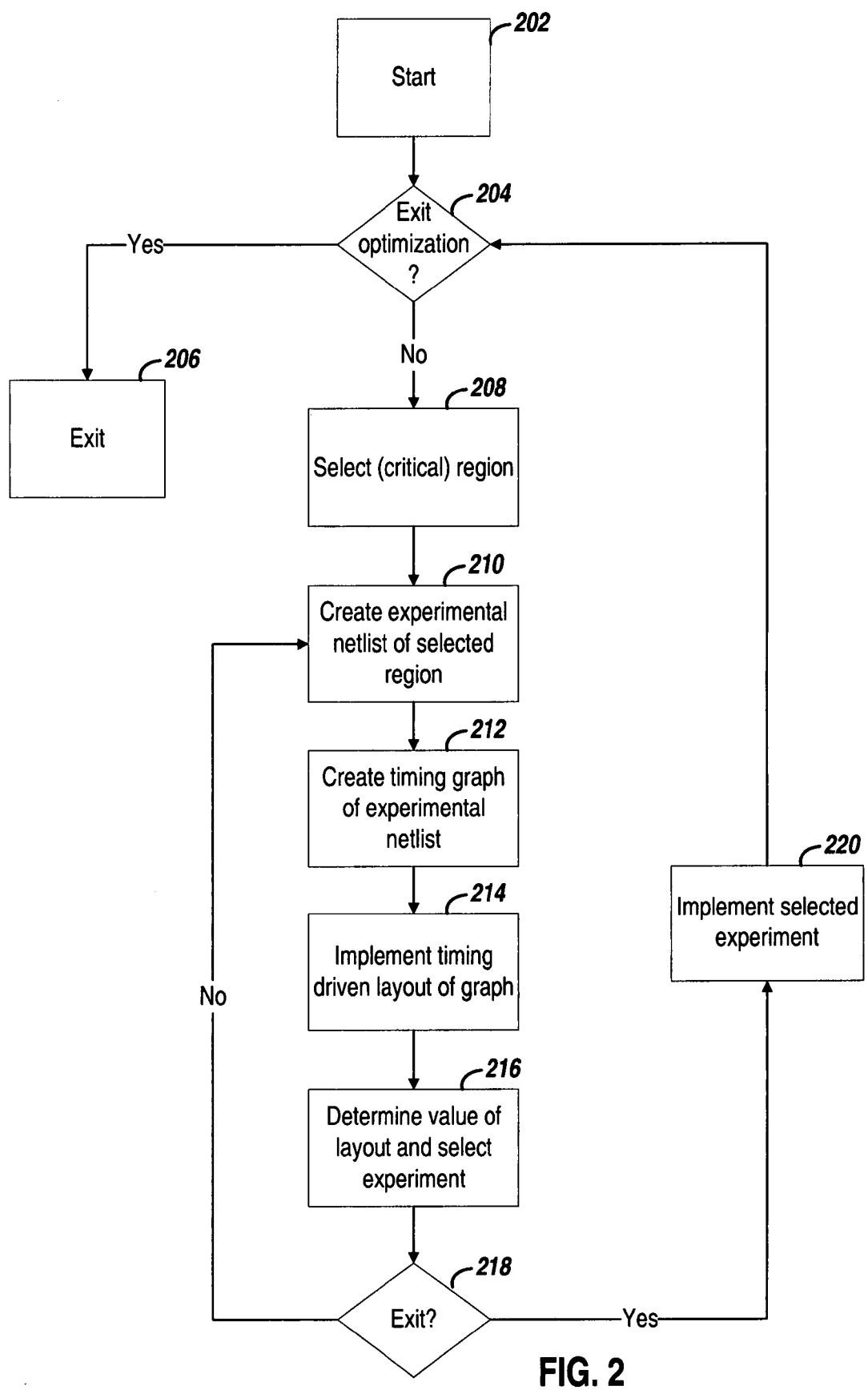
FIG. 2 depicts a detailed flow diagram of an iterative process for creating multiple alternative graphs and selecting one of the graphs to be used for physical synthesis of a PLD, according to an example embodiment of the invention.

FIG. 2 shows a flow diagram of an iterative process of creating multiple alternative graphs, according to another example embodiment of the invention. The process begins at step 202 and ends at step 206. One or more processors and a suitable memory arrangement may be arranged to implement the various steps.

At step 202, the design is ready for the optimization process to begin. In one instance, this occurs after the placed-and-routed netlist has been generated. This allows for accurate timing approximations to be determined for the various nodes in the netlist.

At step 204, the process determines whether or not the optimization process is complete. One or more exit criteria can be used in this step. Examples include, but are not limited to, meeting all rule constraints (e.g., timing), exceeding a maximum number of iterations, insignificant timing improvement over some number of iterations, exhausting all possible circuit transformations and exceeding a limit on the time the process runs. These and other exit criteria can be used alone or in combination. If the process is complete, the process exits at step 206. Otherwise, the process proceeds to step 208.

At step 208, the process selects a subset graph from the netlist. If, for example, optimization is desired for the entire design, the selection may be arbitrary. In a specific embodiment, this step involves identifying the design objects that have timing violations and collecting them. In another instance, various heuristics may be employed to limit the selected set to the design objects that are likely to improve the overall design the most.

At step 210, an experimental/alternative netlist is created for the selected subset. The process generates a potential experiment (alternative subset graph) and determines whether the proposed experiment is feasible. For example, the process might first determine whether the experiment violates constraints imposed on the design by the user or whether the design contains anomalous conditions due to its construction. The feasibility checks include, but are not limited to, verifying that the following conditions are met:

there were no problems in the correlation of the tentative (new) pins;

tentative synchronous inputs that correlate to the same pin in the original topology are not covered by different constraints;

a hidden (deleted) block that is explicitly referenced as a source, intermediate, or destination point in a user constraint, has a corresponding tentative counterpart in the experiment; and a hidden pin or signal may not be explicitly referenced as a source, intermediate, or destination point in a user constraint.

As part of the feasibility check (see above), and for other uses within this flow, including seeding the timing state and patching the tentative sub-graphs into the existing timing graphs (see below), the process correlates the tentative pins in the experiment to their counterparts in the original design topology. Initially, the process merely iterates over these tentative pins and requests this information from the synthesis tools. The process then validates the correlation, as there may be situations where the information returned is inaccurate or incomplete due to the underlying complexities of the problem.

The following checks may be made to validate correlation:

that the correlated pin is not itself on a tentative block;

that it has the same directionality (input, output) as the tentative pin; and that it is of the same type as the tentative pin (e.g., clock input, synchronous input).

For a tentative, synchronous input pin, if the checks result in a set of correlated pins that are also synchronous, the correlation is complete and correct. However, if the checks result in a non-synchronous pin being correlated to tentative synchronous pin, the correlation is invalid. Accordingly, the process may determine the correct synchronous correlation. For example, the procedure in Table 1 below may be performed to infer the correct synchronous correlation.

Given the tentative synchronous input, obtain the set of requirement paths (paths from the synchronous input to its reference clock);

From each requirement path, get its tentative clock pin;

From each tentative clock pin, get its propagation (clock-to-output) paths;

From each clock-to-output path, get its tentative output pin;

Use this tentative output pin to obtain the correlated output pin in the existing design (using the simple correlation from physical synthesis);

Use this correlated output pin on the existing design to get the clock-to-output paths on the existing block;

From each of these existing clock-to-output paths, get its clock pin;

With this existing clock pin, get its requirement paths;

From these existing requirement paths, obtain the synchronous inputs on the existing block; and Use the resulting synchronous inputs as the correlation pins for the tentative synchronous input.

Table 1

At step 212, the process generates a timing/sub-graph from the netlist created in step 210. In creating the sub-graph(s) that represents the experiment, the process first determines the experiment's periphery. The experiment's periphery is the set of source pins and sink pins that ultimately serve to define potential sources and sinks of the tentative sub-graph(s) that embody the experiment. Drivers of tentative block pins, that aren't themselves hidden or tentative, define the sources for any tentative sub-graph(s). Similarly, loads of tentative block pins, that aren't themselves hidden or tentative, define the sinks for any tentative sub-graph(s).

Each of the tentative pins is examined during this process. Tentative clock inputs are stored as potential sources for subsequent tentative sub-graph creation. The tentative clock pin is also stored as a sink to seed creation of tentative clock sub-graphs. At this time, the tentative pin is correlated to any similar pins in the original design. Tentative synchronous input pins are stored as candidate sinks for the tentative sub-graphs and the pin is correlated. For input pins, the process gathers their immediate periphery pins, which equal the set of non-hidden, non-tentative drivers of the input pin, and stores them as sources for the tentative sub-graphs. For output pins, the process also gathers their immediate periphery pins, which would include the set of loads on non-hidden, non-tentative blocks.

The process then iteratively processes each of the existing timing graphs using the procedure of Table 2.

For each graph, filter the periphery sources and sinks to only include those that correlate to nodes that are present in the current graph; and Use this filtered set of sources and sinks to seed the creation of a new tentative sub-graph that is associated with the current parent graph.

Table 2

This association can then be used to patch in the tentative sub-graph to the parent graph, if the experiment is deemed beneficial.

At step 214, the process implements a timing driven layout for the sub-graph. Once a timing graph is created to represent the experiment, the process associates the sources of the graphs with the maximum arrival times from the corresponding correlated nodes. Similarly, the process associates the sinks of the graphs with minimum required times from the corresponding nodes in the top-level timing database. Arrival times are propagated forward through the sub-graph, and required times are propagated backward through the sub-graph, updating the timing state (including slack) of every node in the timing graph. Thus, timing analysis can be accomplished in isolation from the parent graph for the particular experiment.

During the layout of the experiment, the delays on the connections and blocks may be used to propagate arrival times from the sources and to determine required times from sinks to all the intermediate nodes in the tentative graph. Various timing state information, such as slack, number of critical paths etc., may be queried on the objects in the experiment. Layout tools, such as place & route, may perform timing driven optimizations on the experiment using timing state information.

In step 216, the layout value or gain of the experiment is determined. This may include comparing the current experiment with the original subset graph and any previous experiments. In this manner, the process may choose between the experiments based upon their respective gains. The process determines and compares the gains of the experiments in order to select the best graph.

In one embodiment, the process may determine the gain using the timing graph created for the experiment to compare the slacks of the sinks in the tentative graph with the parent graph. The gain function may be implemented as the difference in the worst path slack before and after the transformation. In another embodiment, gain may be the difference in the aggregate violation at the experiment periphery compared to the aggregate violation at the corresponding nodes in parent graph. When gains are the same, the difference in the number of failing paths on the experimental region can be used as a tiebreaker to gauge the merit of a transformation. Various other implementations may be used, for example, the process may compare gains using several different criteria that are weighted according to their importance.

At step 218, the process determines whether or not to repeat steps 210-216 for a different alternative subset graph. As discussed above, various criteria can be used to make the determination. If the process determines that no more alternative subset graphs should be considered, the process proceeds to step 220.

At step 220, the process "implements" or "commits" the selected subset graph. The experimental modifications are committed into the design netlist to thereby realize the gain. To accomplish this, the process may follow an incremental update process on the design level netlist. In one embodiment the process outputs a notification that the timing database should be updated appropriately to match the new design state. Such an incremental update approach is particularly useful for transforming the pre-experimental timing state into a post-experimental representation, while avoiding the overhead that a brute-force destroy-and-reconstruct methodology might encounter.

In previous steps the process created a set of tentative timing sub-graphs to represent the timing state of the experimental portion of the design. These tentative subset graphs were bound to a parent graph that contains the pre-experimental timing topology and state. During a commit operation, all these distinct yet related graphs may be merged together to create a single graph representation to be used as the input for subsequent physical synthesis operations or as the end product for final analysis.

The graph merging operations may be broken down into three main phases. In the first phase, the nodes in the tentative graph are examined and underlying design object state information is used to create a patch instruction set for the tentative graph. Information from this phase is also used to generate some of the patch instructions for the parent graph. In phase two, the parent graph is processed, and nodes and arcs that cover discarded pieces of the design topology are added to the parent graph patch instructions such that they can be excised at a future point. Finally, in phase three, the patches are applied to both the tentative and parent graphs and the underlying nodes and arcs are deleted, moved or added as appropriate. A more specific and detailed representation of such merging options is discussed in connection with FIG. 6.

Figure 3:
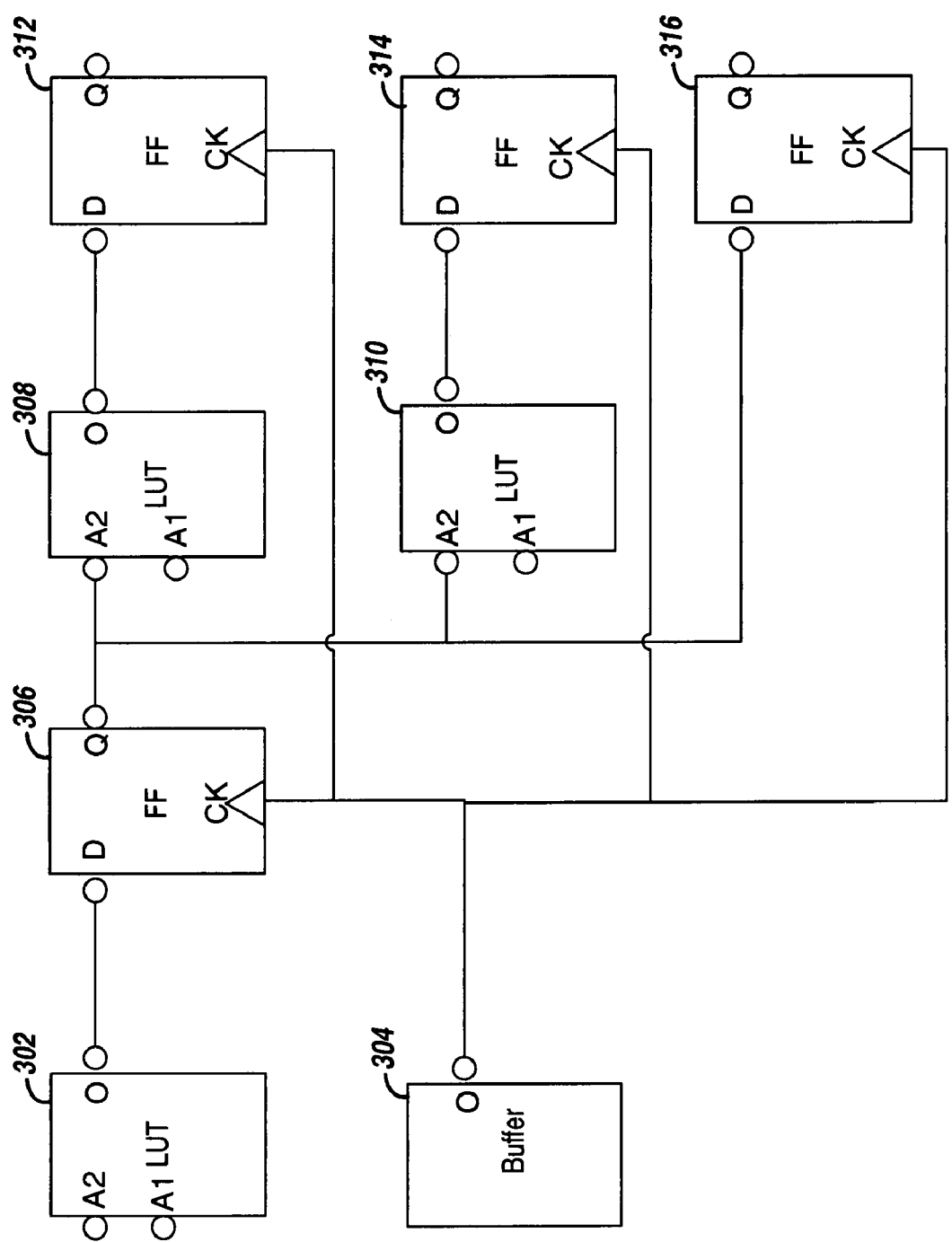
FIG. 3 depicts an example design portion taken from the primary design and targeted for optimization, according to an example embodiment of the present invention.

FIG. 3 shows an example selected graph, according to an example embodiment of the invention. Logic/resource blocks 302-316 represent various buffers, combinational look-up-table (LUT), and flip flop (FF) blocks connected by interconnection resources. A number of circuit paths make up the selected graph. For instance, one circuit path consists of blocks 302, 306, 308 and 312 and the interconnections between them. In this example, buffer 304 provides a clock signal for FF blocks 306, 312, 314 and 316, while LUT blocks 302, 308 and 310 provide configurable logic blocks.

As discussed herein, the subset graph shown in FIG. 3 may have been selected in response to a net or circuit path that exceeded rule constraints. The process may target the circuit path(s) associated with such rule constraints for changes. For example, the output of FF 306 may have been identified as violating timing constraints. One possible optimization would be to reduce the loading (and therefore the delay) on the output of FF 306 by replicating FF 306, thereby splitting some of the loads of FF 306 with another tentative FF.

Figure 4:
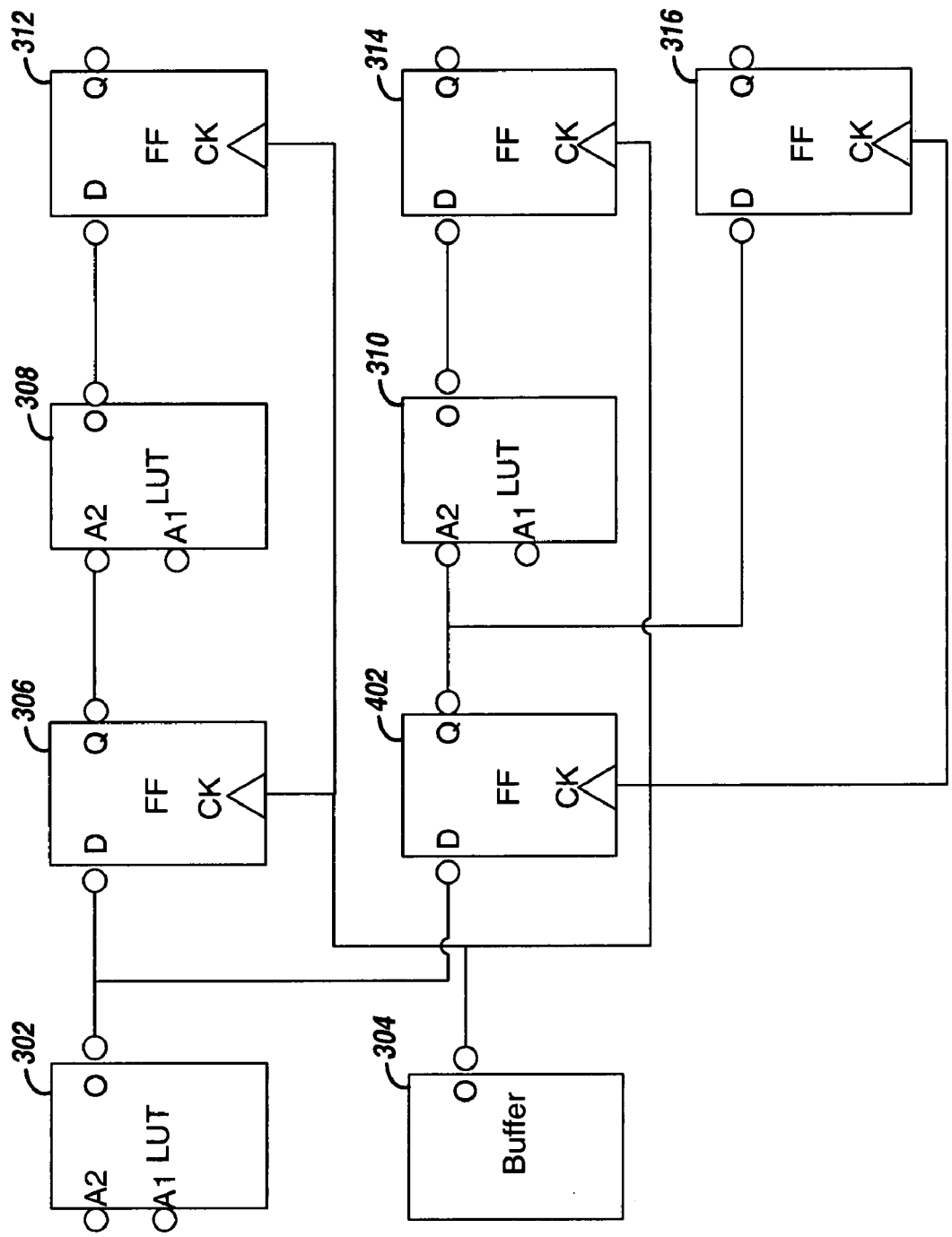
FIG. 4 depicts an example alternative/experimental design to be evaluated with regard to the design portion of FIG. 3, according to an example embodiment of the present invention.

FIG. 4 shows an example alternative subset graph derived from the subset graph of FIG. 3. Specifically, FF 402 was added in parallel with FF 306. This added FF 402 has a direct effect on both the input and outputs associated with FF 402, 302, 310, 316, and FF 306. For instance, the output of 302 sees a new load of FF 402, while the output of FF 402 now drives the inputs of LUT 310 and FF 316. Moreover, buffer 304 sees an additional load because FF 402 is clocked by the output of buffer 304. Thus, even a simple change to the selected subset graph may result in changes to a number of different nodes and circuit paths.

In one embodiment, the gain of the alternative graph shown in FIG. 4 is computed based upon slack. Slack can be considered as the difference between the actual timings of the graph and the desired or required timings. For instance, the input of FF 316 may see a delay of 180 ps from the output of FF 402, while the input of LUT 310 sees a delay of 150 ps from the output of FF 402. If both FF 316 and LUT 310 have the same timing constraints, then the input node of LUT 310 has 30 ps more slack than the input node of FF 316. The timing constraints can be drawn from a number of different sources including, but not limited to, rule requirements from the top-level design or based upon the arrival time of the clocking signal.

Figure 5:
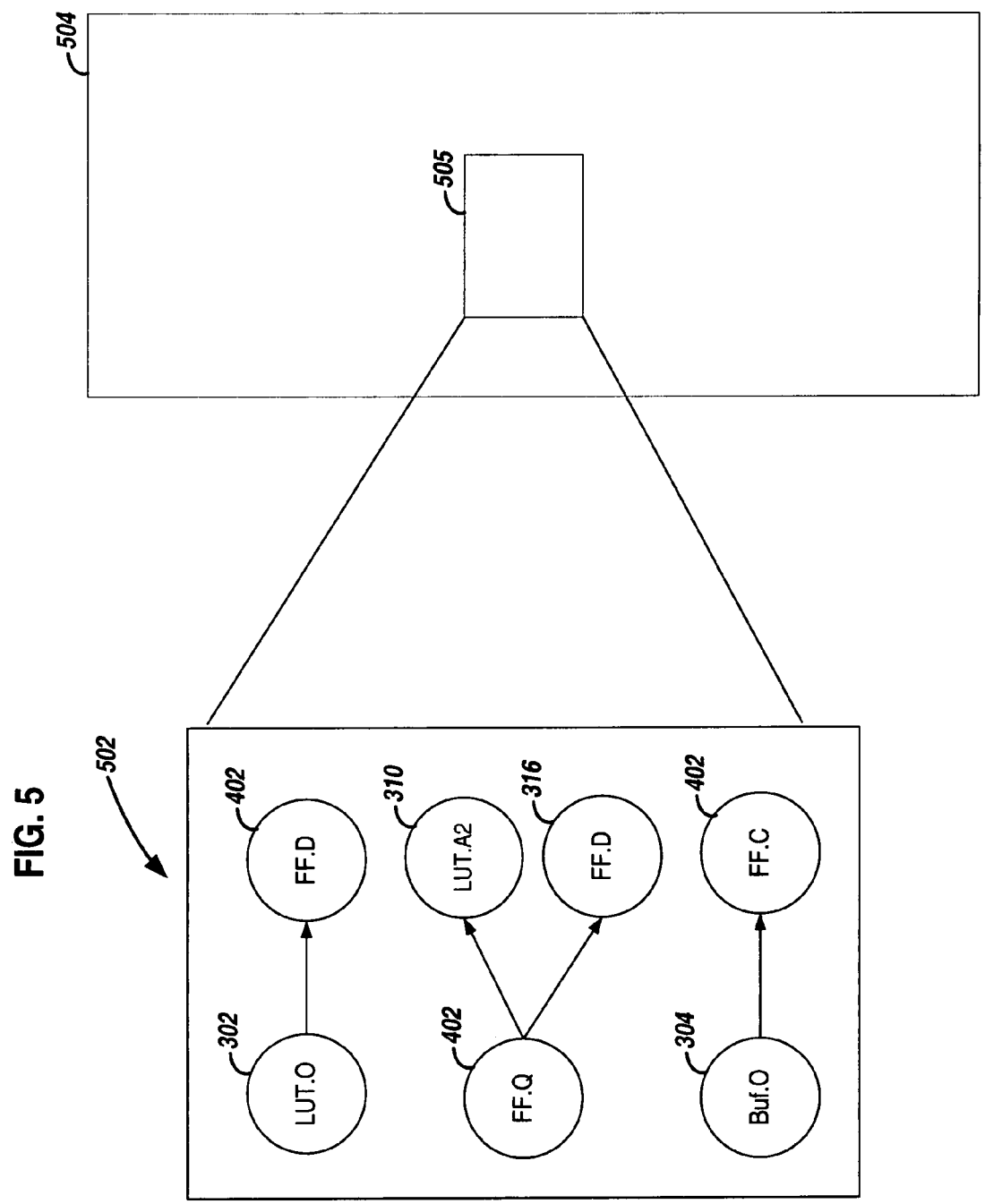
FIG. 5 depicts an example directed graph representation of a selected portion from a larger directed graph, according to an example embodiment of the present invention.

FIG. 5 shows an example subset DAG representation taken from a larger DAG representation, according to an example embodiment of the invention. Subset DAG 502 represents a portion of DAG graph 504. In this instance, the nodes depicted in subset DAG 502 collectively represent portion of the circuit depicted in FIG. 4. More specifically, subset DAG 502 represents tentative (newly added) portions of FIG. 4 with respect to the original circuit shown by FIG. 3. Thus, LUT 302 has an output node connected to an input of node 402; the FF 402 has an output node connected to input nodes of both LUT 310 and FF 316; and buffer 304 has an output connected to a clock input of FF 402. This representation of the new nodes and arcs is useful for discussing the process of implementing or committing the alternative subset graph into the original design as discussed further in connection with FIG. 6.

Figure 6:
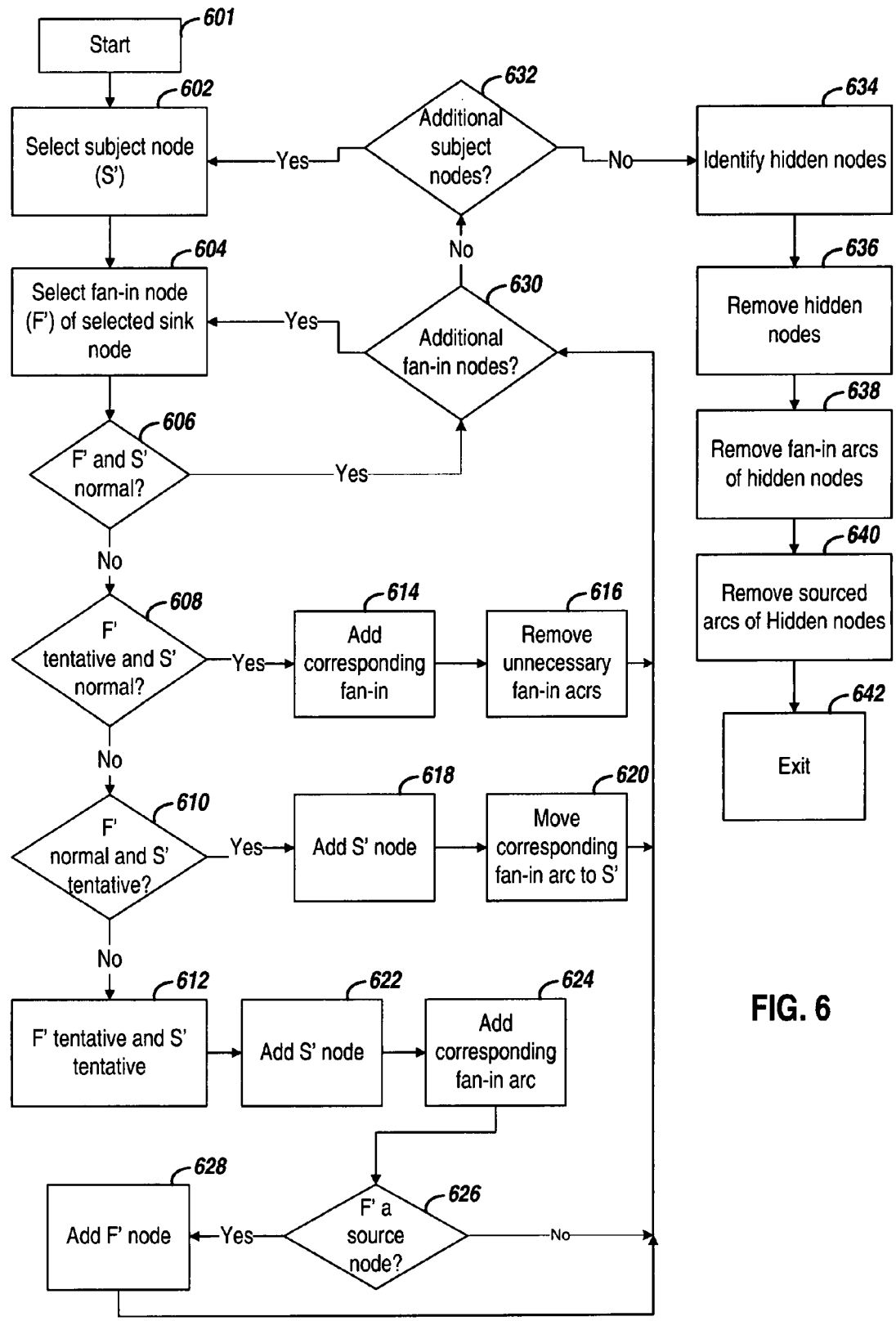
FIG. 6 depicts a flow diagram for commitment of a selected experimental/alternative graph, according to an example embodiment of the present invention.

FIG. 6 shows a flow diagram for committing a selected alternative subset graph to the original (top-level) design, according to an example embodiment of the invention. During physical synthesis flow, the process determines an experiment to be gainful and may elect to commit the experimental modifications into the original design netlist and thereby realize the gain. To accomplish this, the process performs an incremental update on the design level netlist. A notification is output to indicate that the timing database should be updated to match the new design state. The incremental update approach transforms the pre-experimental timing state into a post-experimental representation. Such an approach can be useful for avoiding the overhead that a brute-force destroy-and-reconstruct methodology might encounter.

Consistent with the aforementioned processes, the graph merging operations can be broken down into three main phases. In the first phase, the process examines the nodes in the tentative graph and uses the underlying design object state information to create a patch instruction set for the tentative graph. The process also uses information from this phase to generate some of the patch instructions for the parent graph. In the second phase, the process adds nodes and arcs that cover discarded pieces of the design topology to the parent graph patch instructions such that they can be excised at a future point. Finally, in the third phase, the process applies the patches to both the tentative and parent graphs and by deleting, moving or adding the underlying nodes and arcs as appropriate.

As used herein, and unless otherwise stated, the following terms and their descriptions are used as follows. A tentative node is a graph node that represents a design pin that is part of the experimental netlist and that did not exist in the pre-experimental design. A hidden node is a graph node that represents a design pin that is part of the pre-experimental netlist but is absent from the post-experimental design. Finally, a normal/preexisting node is a node that represents a design pin that is part of both the pre- and post-experimental netlists.

Phase one begins at the start step 601 and the process proceeds with the selection of a subject node S', as shown at step 602. This phase includes a substantial portion of the logic required for generating the appropriate patch instruction sets. The tentative graph contains much of the information needed to guide merging operations and is, therefore, utilized extensively for this phase. In a particular implementation, the process implements an algorithm that recursively walks through the tentative graph starting from its sink nodes and heading toward its source nodes. Nodes encountered along the traversal are processed and compared pair wise with each of their fan-in nodes. Thus, for S' a fan-in node F' is chosen, as shown in step 604. The iterative process includes four possible scenarios that are represented by steps 606, 608, 610 and 612.

At step 606, the process determines whether or not the fan-in node (F') and subject node (S') are both preexisting nodes. In this case, the process proceeds to step 630 because no merging operations are necessary. The two tentative graph nodes (F' and S') and the arc connecting them (A') directly correlate to equivalent preexisting objects in the parent graph (F, S, and A). This small piece of the topology is unchanged in the experimental context and therefore no removal, addition or relocation patch operations are required. Pseudo-code for this operation is shown in Table 3 below:

TABLE 3

```
if isPreExistingNode(F') && isPreExistingNode(S')
{
    /* No patching operations required! */
    continue;
}
```

At step 608, the process determines whether or not the fan-in node (F') is a tentative node while the subject node (S') is a preexisting node. If this is the case, the process proceeds to steps 614 and 616. This scenario describes the situation in which a tentative pin drives a preexisting pin. The preexisting node in the tentative graph (S') should correlate back to an equivalent preexisting node in the parent graph (S). As such, there is no need to relocate the tentative graph's subject node (S') nor perform any patching operations on the parent graph node (S). The tentative graph's fan-in node (F') is new, and thus, so is the tentative graph arc (A') connecting F' and S'. This graph arc is moved to the parent graph and altered such that it connects A' with S. The fan-in list of S must also be updated to reflect the new arc A', as shown in step 614. Note that no merging operations are necessary on F' in this step. Eventually, F' will be relocated to the parent graph but that operation will be accomplished as part of the recursion when F' becomes the subject pin of a pair wise node comparison.

In addition to the tentative graph to parent graph merging operations, this situation also includes an examination of a small portion of the parent graph. Namely, the process examines the original fan-ins of the correlated subject node in the parent graph (S). In an instance where the network associated with the source node of such a fan-in differs from the network associated with the subject node (S), the fan-in arc itself must be removed because the topology is no longer valid. This step is shown in step 616.

The register replication example of FIG. 4 shows an instance of this scenario with respect to subject node 402 of the tentative graph and to input node of 316. The subject node 402 is tentative and drives the preexisting node 316. The preexisting node 316 correlates back to the preexisting node in the parent graph. The arc from 402 to 316 is new and will be moved to the parent graph and altered such that its destination node becomes 316 of the original graph instead of 316 of the tentative graph. Further, the state of original node 316 is modified to reflect the newly added fan-in arc. Finally, the original input arcs of 316 are examined as well as compared to their source and destination nodes' networks. In this example, the original parent graph arc from 306 to 316 is no longer valid and will be removed.

The pseudo-code for this scenario is presented in Table 4 below.

TABLE 4

```
if isTentative(F') && isPreExistingNode(S')
{
    /* Update any invalid parent graph topology based on network */
    /* mismatches. */
    foreach arc a in S.fan-ins
    {
        if a.sourcenode.network != S.network
        {
            S.fan-ins.remove(a)
        }
    }
    /* Merge the new arc seamlessly into the parent graph. */
    A'.destnode ← S
    S.fan-ins ← S.fan-ins U A'
    grapharcs[P] ← grapharcs[P] U A'
}
```

At step 610, the process determines whether or not the fan-in node (F') is preexisting while the subject node (S') is tentative. If this is the case, the process proceeds to steps 618 and 620. This scenario describes the case where a preexisting pin drives a new, tentative pin. As shown by steps 618 and 620, two merging operations are performed for such a case. First, the tentative subject node (S') is added into the parent graph, as shown by step 618. Second, the subject node's input arc A' (having source node F') is shifted from the tentative graph to the parent graph and the arc's source node F' is replaced with the equivalent, correlated node F present in the parent graph as shown in step 620.

The register duplication scenario of FIG. 4 shows an example of this scenario with respect to the processing of node 402 of the tentative graph. The pair-wise comparison examines fan-in node 302 along with subject node 402. Node 302 is a preexisting node having an equivalent node 302 in the parent graph. Node 402 is a new, tentative node having no corollary back in the parent graph. Merging operations move node 402 into the parent graph. Additionally, the arc connecting node 302 and node 402 is moved to the parent graph as it is new with respect to the parent graph. Finally, the tentative graph arc's source node 302 is associated with the parent graph's node 302 so that the arc fits seamlessly into the parent graph topology.

The pseudo-code for scenario three is presented in Table 5 below.

TABLE 5

```
if isPreExistingNode(F') && isTentative(S')
{
    /* Merge the new node and new arc seamlessly into the parent graph. */
    graphnodes[P] ← graphnodes[P] U S'
    grapharcs[P] ← grapharcs[P] U A'
    A'.sourcenode ← F
}
```

At step 612, the process determines that both the fan-in node (F') and the subject node (S') are tentative. In this instance, a tentative pin drives another tentative pin. The merging operations include moving all relevant objects from the tentative graph to the parent graph. This includes the new subject node S' and the relevant fan-in graph arc A', as shown in steps 622 and 624. It may also include the tentative fan-in node F' depending on whether F' is a source node of the graph. Specifically, if F' is a source node of the graph, then no further pair wise comparisons will be encountered along this branch. As such, the process determines at step 626 whether or not F' is a source node. If F' is a source node, F' is merged as part of the pair wise processing step for subject node S' as shown by step 628. If F' is not a source node in the graph, merging is performed in the subsequent pair wise processing step handles F' in a subject node context.

The register replication example of FIG. 4 shows an instance of this scenario with respect to the processing of the output of node 402 as a subject node. A fanin arc of node 402 is the clock input of node 402. Each of these nodes is tentative. Thus, both the fanin clock node and the output node are merged into the parent graph. Example pseudo-code for this scenario is described in Table 6 below:

TABLE 6

```
if isTentative(F') && isTentative(S')
{
    /* Merge the arc and the tentative subject node into the parent graph. */
    graphnodes[P] ← graphnodes[P] U S'
```

TABLE 6-continued

```
grapharcs[P] ← grapharcs[P] U A'
/* Handle the case where F' is a source since recursion won't find a pair
wise node comparison in such a case*/
if isSourceNode(F')
{
    graphnodes[P] ← graphnodes[P] U F'
}
}
```

After completing one of the process paths depicted by steps 606-628, the process continues to step 630 where it is determined whether additional fan-in nodes exist for the current subject node. If additional nodes exist, the process proceeds to step 604. Otherwise the process proceeds to step 632 to determine whether additional subject nodes exist. If the step of adding or removing additional nodes exists, the process proceeds to step 602. Otherwise the first phase is considered complete and the process moves to step 634 (the second phase) in which obsolete parent graph topology is excised.

The specific order in which the various fan-ins and subject nodes are processed is amenable to various software algorithms including a depth-first iterative process that proceeds through each fan-in path up to a source node before processing other fan-ins of the starting node. For simplicity, the discussion herein has been limited to a breadth-first iterative process that checks each fan-in node of a subject node before proceeding to the next subject node.

During a physical synthesis experiment, much of the altered topology may be in the form of new, tentative design objects. It is possible however, that some of the topology changes will also be in the form of removals of previously existing topology. During the actual experiment, this topology is still present in the actual netlist but is marked hidden to denote that algorithms should treat it as if it weren't there. During a commit operation, hidden design objects are removed from the netlist, as shown by step 636.

Relative to a timing database, design objects that are removed from the netlist are also removed from the timing database in order to maintain a consistent state. Tentative sub-graphs by definition do not contain the hidden design objects because they are simply not incorporated into the sub-graphs. As such, tentative sub-graphs need no post-processing for obsolete design objects during the commit phase. The parent graph, however, was generated prior to the experimental sub-graphs and may contain portions of the topology that were subsequently made obsolete during a commit operation.

To remove obsolete portions of a parent graph, the process may implement an algorithm utilizing the data from the experiment to determine which design objects were hidden. The hidden design pins are correlated to parent graph nodes and patch instructions are generated for the several cases. As shown in step 634, parent graph nodes representing a hidden design pin are removed from the parent graph. At step 636, fan-in graph arcs of a hidden graph node are removed from the parent graph, and at step 638, graph arcs sourced by a hidden graph node are removed from the parent graph. The process then exits at step 642 having generated the patch instructions.

After patch instructions for parent and tentative sub-graphs have been generated during the first two phases, the third phase involves receiving the patch directives as an input and applying the directives to generate modified parent and tentative graphs as an output.

The third phase may be implemented in such a manner so as to maintain the simplicity present in the first two phases. The algorithmic descriptions of the first two phases do not necessarily address concerns related to synchronization of merging operations. These concerns may exist but are addressed through the use of graph patching abstractions.

As an example of these synchronization concerns, the details of one of the tentative F' and preexisting S' situations are explained. In an example scenario, the tentative graph arc (sourced by a tentative F' node) is moved into the parent graph. If this instruction was implemented at the same time it was generated, there would be a synchronization issue. Namely, the F' node is part of the graph arc's context but there would be no explicit instruction that it too should be moved to the parent graph. Looking ahead, the algorithm would call for exactly this move on the next pair-wise iteration but this information would not be available to the merging operations until that iteration actually occurred. If the controlling logic decided to go ahead and move the F' node, there could be a duplicated node after F' was moved on the next pair-wise iteration. Alternatively, if the control logic did not move the F' node, the relocated graph arc would be referencing a node that didn't exist in the parent graph context leading to an inconsistent database state. Thus, duplication and mismatches between nodes would occur without some synchronization mechanism.

To solve such synchronization issues, a graph patching abstraction may be utilized. The control logic monitors the high-level algorithmic details of merging and instructs the graph patching abstraction accordingly. The graph patcher interprets and stores patching directives without immediately executing them upon issuance. Once all patch directions have been generated, the patchers are then instructed to apply the changes. This allows the patchers to perform consistency checking and execute the requests in an order that maintains a consistent database state.

Once the patches have been applied, the parent graph will be consistent with the new design netlist and ready for either subsequent physical synthesis experiments or final timing analysis. The tentative sub-graphs will be subsets of their prior state having had the appropriate topology moved into the parent graph. The remaining portions of the tentative sub-graphs can be safely discarded thereby readying things for any subsequent experiments.

Figure 7:
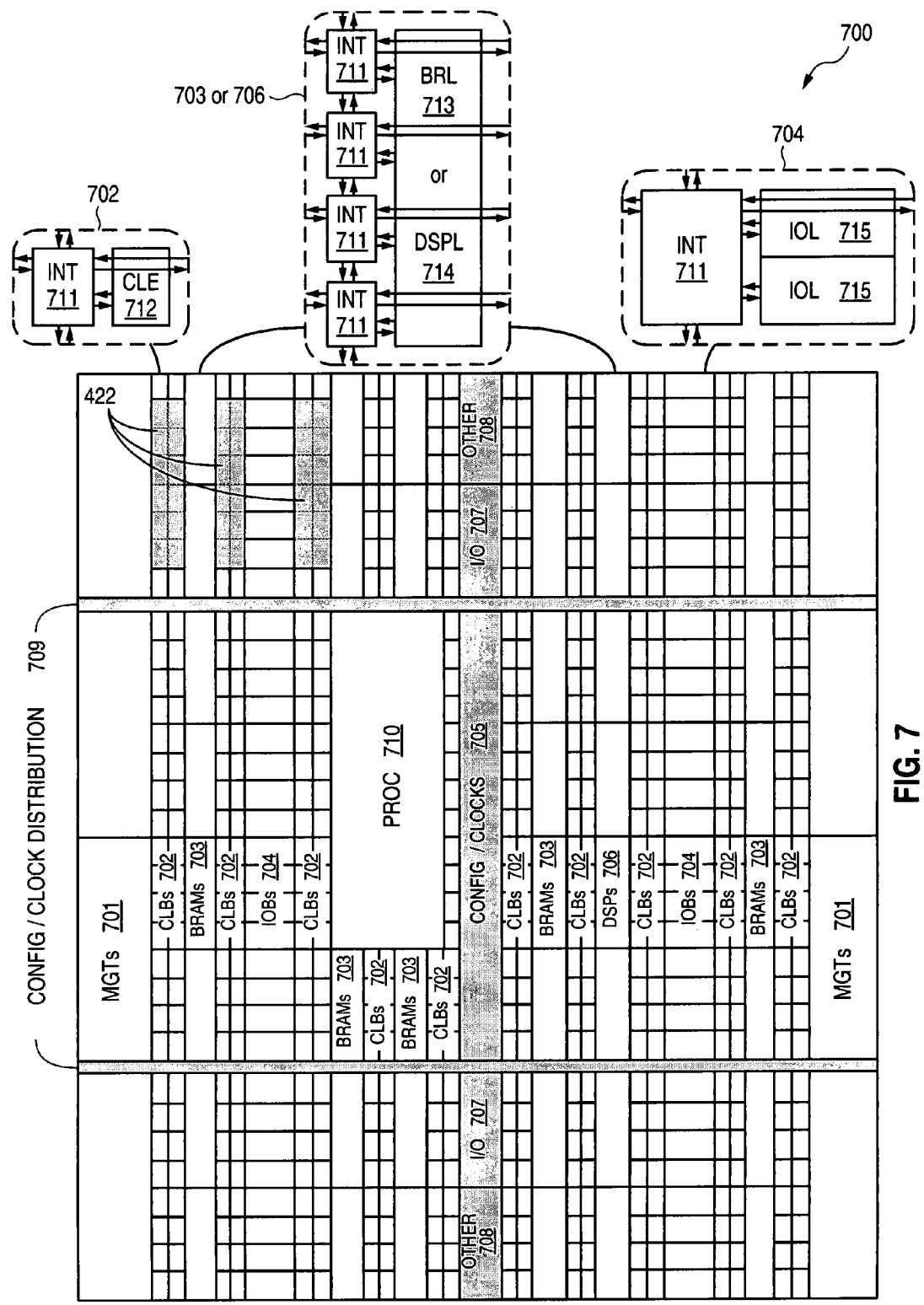
FIG. 7 depicts an example block diagram of an FPGA device programmed according to the resulting netlist, according to an example embodiment of the present invention.

FIG. 7 is a block diagram of an example FPGA architecture that may be used in implementing various embodiments of the invention. FPGA architecture 700 includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. A processor-implemented method for processing an electronic circuit design, the design represented by a netlist and a corresponding primary timing graph identifying a plurality of input and output pins and a plurality of resource blocks and a plurality of connections between the plurality of input and output pins, comprising:
   executing program code by a processor, the code causing the processor to perform operations including:
      selecting a subset timing graph from the primary timing graph in a memory;
      generating one or more alternative subset timing graphs that are functionally equivalent and structurally different with respect to the selected subset timing graph;
      for each of the one or more alternative timing graphs, determining a respective timing metric;
      comparing each determined timing metric and a timing metric for the selected subset timing graph;
      selecting one of the one or more alternative timing graphs in response to the comparison;
      verifying structurally different portions of the selected one of the one or more alternative timing graphs against design constraints; and
      storing the structurally different portions to the primary timing graph in the memory.

2. The method of claim 1, wherein the step of selecting a subset includes identifying portions of the subset timing graph that do not meet design timing constraints.

3. The method of claim 1, further comprising the step of repeating the steps of selecting a subset timing graph, generating, determining, comparing, selecting one alternative timing graph, verifying, and storing for at least one other subset timing graph.

4. The method of claim 1, wherein the step of verifying includes determining inconsistencies between respective portions of the netlist and input pins, output pins, resource blocks, and connections of the one or more alternative timing graphs.

5. The method of claim 1, wherein the step of storing includes, for first and second resource blocks in the alternative timing graph, the first resource block driving an input to the second resource block, determining whether each of the first and second resource blocks in the alternative timing graph have a preexisting version of the first and second resource blocks in the primary timing graph.

6. The method of claim 5, wherein the step of storing further includes, in the primary timing graph,
   leaving unchanged, first and second resource blocks in the primary timing graph in response to both of the first and second resource blocks in the alternative timing graph having equivalent first and second resource blocks in the primary timing graph;
   storing to the primary timing graph, a connection designating the first and second resource blocks in response to the first resource block in the alternative timing graph not having an equivalent first block in the primary timing graph and the second resource block in the alternative timing graph having an equivalent second resource block in the primary timing graph;
   in response to the first resource block in the alternative timing graph having an equivalent first block in the primary timing graph and the second resource block in the alternative timing graph not having an equivalent second block in the primary timing graph, storing to the primary timing graph, a resource block equivalent to the second resource block and storing a connection between the first resource block and the second resource block;
   storing to the primary timing graph, a resource block equivalent to the second resource block and a connection to the equivalent resource block in response to both the first resource block and the second resource block in the alternative timing graph not having equivalent first and second resource blocks in the primary timing graph; and
   storing to the primary timing graph, a resource block equivalent to the first resource block in the alternative timing graph in response to both the first resource block and second resource block not having equivalent first and second blocks in the primary timing graph and the first resource block being a source node.

7. The method of claim 6, wherein the step of storing the structurally different portions to the primary timing graph is performed for multiple blocks of the selected alternative graph, beginning at sink blocks and ending at source blocks.

8. The method of claim 1, wherein the step of storing further includes removing resource blocks that are in the primary timing graph but not in the selected alternative timing graph.

9. The method of claim 1, wherein the step of storing further includes removing connections to the nodes that are in the selected subset timing graph but are not in the selected alternative timing graph.

10. The method of claim 1, wherein the step of comparing the determined timing metrics includes determining a difference between a first worst-case slack and a second worst-case slack, the first worst-case slack being a least slack value of the selected subset timing graph, the second worst-case slack being a least slack value of an alternative timing graph.

11. The method of claim 1, wherein the step of determining includes determining a change in the timing metric as a difference between a first total failing slack and a second total failing slack, the first total failing slack being a sum of a plurality of failing differences between arrival times for the subset timing graph and required times, the second total failing slack being a sum of a plurality of failing differences between arrival times for an alternative timing graph and required times, wherein a failing difference is a difference where the arrival time is later than the required time for a particular node.

12. The method of claim 1, wherein the step of selecting one of the one or more alternative timing graphs includes selecting an alternative timing graph having a largest amount of change in the timing metric between the one or more alternative timing graphs and the selected subset timing graph.

13. The method of claim 1, wherein the step of generating one or more alternative subset timing graphs includes the steps of replicating the subset timing graph and changing, in the replicated subset timing graph, at least one of an input pin, an output pin, a connection and a resource block with respect to the subset timing graph.

14. An apparatus for processing an electronic circuit design, the design represented by a netlist and a corresponding primary timing graph identifying a plurality of input and output pins and a plurality of resource blocks and a plurality of connections between the plurality of input and output pins, the apparatus comprising:

means for selecting a subset timing graph from the primary timing graph;

means for generating one or more alternative subset timing graphs that are functionally equivalent and structurally different with respect to the selected subset timing graph;

means for determining, for each of the one or more alternative timing graphs, a respective timing metric;

means for comparing each determined timing metric and a timing metric for the selected subset timing graph;

means for selecting one of the one or more alternative timing graphs in response to the comparison;

means for verifying structurally different portions of the selected one of the one or more alternative timing graphs against design constraints; and means for storing the structurally different portions to the primary timing graph.

15. The apparatus of claim 14, wherein the step of storing the structurally different portions to the primary timing graph further includes updating a timing graph of the primary timing graph.

16. The apparatus of claim 14, wherein the step of generating one or more alternative subset timing graphs includes associating source arrival times and sink required times from the primary graph.

17. The apparatus of claim 14, wherein the step of verifying includes comparing the alternative subset timing graph to the design constraints of the primary timing graph to determine whether the graphs are compatible.

18. The apparatus of claim 14, wherein the timing metric is based upon a number of sink nodes that exceed their timing constraints.

19. The apparatus of claim 14, wherein the timing metric is based upon a number of paths that exceed their timing constraints.

20. An article of manufacture for processing an electronic circuit design, the design represented by a netlist and a corresponding primary timing graph identifying a plurality of input and output pins and a plurality of resource blocks and a plurality of connections between the plurality of input and output pins, the article of manufacture comprising:

a processor-readable storage medium configured with processor executable instructions for generating an implementation of an electronic circuit design by performing the steps including, selecting a subset timing graph from the primary timing graph;

generating one or more alternative subset timing graphs that are functionally equivalent and structurally different with respect to the selected subset timing graph;

for each of the one or more alternative timing graphs, determining a respective timing metric;

comparing each determined timing metric and a timing metric for the selected subset timing graph;

selecting one of the one or more alternative timing graphs in response to the comparison;

verifying structurally different portions of the selected one of the one or more alternative timing graphs against design constraints; and storing the structurally different portions to the primary timing graph.

* * * * *